United States Patent
Saen et al.

(10) Patent No.: US 8,054,871 B2
(45) Date of Patent: Nov. 8, 2011

(54) SEMICONDUCTOR DEVICE AND SEMICONDUCTOR INTEGRATED CIRCUIT

(75) Inventors: Makoto Saen, Kodaira (JP); Kenichi Osada, Tokyo (JP); Shigenobu Komatsu, Kokubunji (JP); Itaru Nonomura, Tokyo (JP); Yasuhisa Shimazaki, Kodaira (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 420 days.

(21) Appl. No.: 12/370,338

(22) Filed: Feb. 12, 2009

(65) Prior Publication Data
US 2009/0245445 A1 Oct. 1, 2009

(30) Foreign Application Priority Data
Mar. 27, 2008 (JP) .................................. 2008-082483

(51) Int. Cl.
H04L 5/16 (2006.01)
H04B 1/38 (2006.01)
(52) U.S. Cl. ........ 375/219; 375/211; 375/295; 375/316; 361/38; 361/780
(58) Field of Classification Search .................. 375/211, 375/219, 295, 316; 361/38, 780
See application file for complete search history.

(56) References Cited

U.S. PATENT DOCUMENTS

| 6,594,304 | B2* | 7/2003 | Chan .............................. 375/220 |
| 6,690,742 | B2* | 2/2004 | Chan .............................. 375/295 |
| 7,813,415 | B2* | 10/2010 | Wu et al. ........................ 375/219 |
| 2006/0176624 | A1 | 8/2006 | Kuroda et al. | |
| 2006/0176676 | A1 | 8/2006 | Kuroda et al. | |
| 2007/0289772 | A1 | 12/2007 | Kuroda et al. | |

FOREIGN PATENT DOCUMENTS

| JP | 1-222619 A | 9/1989 |
| JP | 2002-223204 A | 8/2002 |
| JP | 2005-228981 A | 8/2005 |
| JP | 2006-050354 A | 2/2006 |
| JP | 2006-173415 A | 6/2006 |
| JP | 2006-173986 A | 6/2006 |

* cited by examiner

*Primary Examiner* — Ted Wang
(74) *Attorney, Agent, or Firm* — Miles & Stockbridge P.C.

(57) ABSTRACT

A semiconductor device including a pair of stacked semiconductor ICs capable of communicating with each other by wireless. Each IC has: a transmitter circuit operable to send, by wireless, transmit data together with a clock signal deciding a transmission timing, and arranged so that the wireless transmission timing is adjustable; a receiver circuit operable to receive data in synchronization with a clock signal received by wireless, and arranged so that its wireless reception timing is adjustable; and a control circuit operable to perform timing adjustments of the transmitter and receiver circuits based on a result of authentication of data returned by the other IC in response to data transmitted through the transmitter circuit, and received by the receiver circuit. This arrangement for near field communication between stacked semiconductor ICs enables: reduction of the scale of a circuit for communication timing adjustment; and highly accurate adjustment of the communication timing.

16 Claims, 6 Drawing Sheets

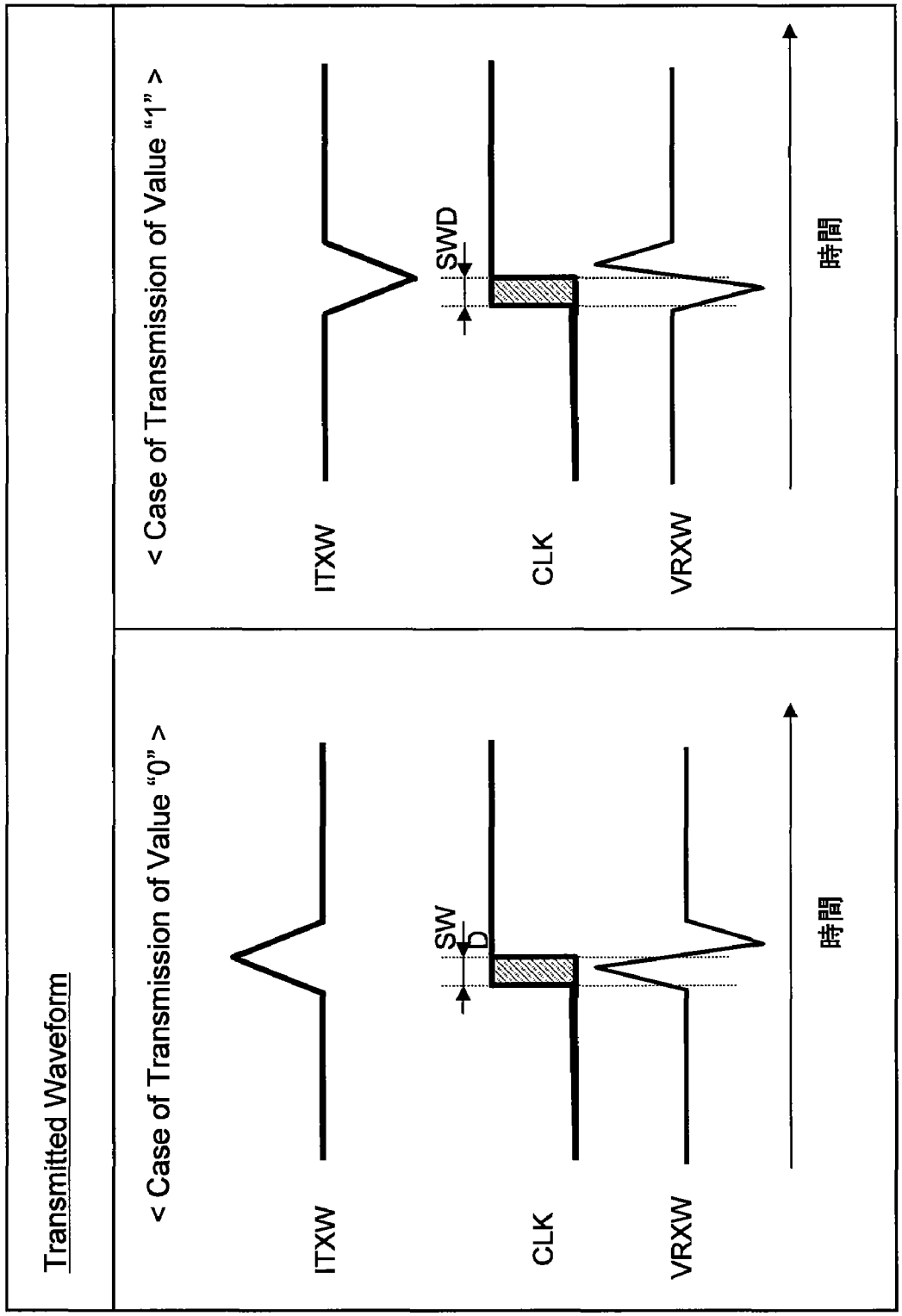

US 8,054,871 B2

SEMICONDUCTOR DEVICE AND SEMICONDUCTOR INTEGRATED CIRCUIT

CLAIM OF PRIORITY

The Present application claims priority from Japanese application JP 2008-082483 filed on Mar. 27, 2008, the content of which is hereby incorporated by reference into this application.

FIELD OF THE INVENTION

The present invention relates to a noncontact near field communication technique between semiconductor integrated circuits mounted on substrates in a stacking form. Further, it relates to a technique useful in applications to a modularized semiconductor device e.g. SiP (System in Package), a semiconductor integrated circuit with a wireless communication interface function used for such semiconductor device, and the like.

BACKGROUND OF THE INVENTION

The performance of semiconductor integrated circuits had been enhanced by integrating more transistors in one chip (semiconductor substrate) with the progress of micromachining techniques. However, the way to increase the scale of integration of one chip as embraced in the past has not necessarily been a most appropriate solution because of the limit of scaling-down or the influence of increase in the cost for using cutting-edge processes. Therefore, three-dimensional integration, by which more than one semiconductor integrated circuit is stacked in three-dimensional directions, has been a promising technique. For enhancement in the performance of semiconductor integrated circuits by the three-dimensional integration, which is herein also referred to as "3D integration" or "3D stacking", a mechanism for performing high-speed and large-capacity communication between stacked semiconductor integrated circuits is required. In addition, the power needed for such communication reaches a considerable level with respect to power consumption by processors and the like. Therefore, a technique for a high-speed and large-capacity communication between semiconductor integrated circuits, especially including a method for executing such communication with a smaller power is made a technique with overriding priority for 3D integration of semiconductor integrated circuits.

As communication systems for stacked semiconductor integrated circuits, wired and wireless systems have been studied. As possible wired systems, there are a system including formation of a via-hole in a silicon substrate of a semiconductor integrated circuit, and a system including wire bonding. However, the former one is limited in the scene where it can be used because formation of a via-hole in a silicon substrate poses a burden in manufacturing process; the latter one is smaller in the effect of 3D stacking in terms of performance and power because of longer wiring. On the other hand, systems that communication is performed by wireless are expected as a useful method for a scene where any wired system cannot be used because of the problems as described above.

In the typical wireless communication used for communication between mobile phones and base stations, wireless LAN and the like, a transmitter sends data after having executed some kind of modulation on the data, and a receiver-side LSI performs sampling at a rate sufficiently higher than the rate of transmitted data, and executes computation on the data thus sampled thereby to reproduce the transmitted data. However, this method involves a larger volume of computation and a greater amount of power consumption, and takes a longer time until a receiving party accepts data. On this account, such method suffices for an application scene that a larger amount of cost may be devoted because of a larger communication field. However it is unsuitable for communication in an extremely near field like between stacked semiconductor integrated circuits because of its excessively large overhead.

Wireless communication techniques which are suitable for communication in a near field like between 3D-stacked semiconductor integrated circuits, and offer smaller overheads are described in the following four patent documents: JP-A-2005-228981, JP-A-2006-50354, JP-A-2006-173415, and JP-A-2006-173986.

In cases of communication between 3D-stacked semiconductor integrated circuits, it is thought advisable to arrange a communication device so that the timing of a communicating operation can be adjusted. This is because individual semiconductor integrated circuits have variations in manufacturing and are influenced by changes of operating conditions including a temperature and an operating source voltage. JP-A-2002-223204 discloses a technique for wired communication, by which an arrangement for correcting a transmission property is adopted on the side of a receiver.

SUMMARY OF THE INVENTION

The inventor examined the timing adjustment for near field communication between 3D-stacked semiconductor integrated circuits. As a result, the following two points were found. The first is that in case of correcting the transmission property on the side of a receiver as described in JP-A-2002-223204, as to the two-way communication like full-duplex communication, wireless communication interface circuits which perform transmission and reception are each required to have a timing adjustment function, and thus the scale of a circuit for timing adjustment is enlarged on the whole.

The second is unlike a communication system that sampling is performed at a rate sufficiently higher than the rate of transmitted data to reproduce the transmitted data as in wireless communication used in wireless LAN, etc., a system that data sent from a transmitter are simply captured by a receiver in keeping with the transmission timing requires extremely high accurate timing adjustment for the timings of transmitting and receiving data to be transmitted and received. In other words, as to a system that data sent from a transmitter are captured by a receiver in keeping with the transmission timing, it is essential for a receiver-side semiconductor integrated circuit to take therein the data sent from the transmitter with an appropriate timing. For instance, data communication between 3D-stacked semiconductor integrated circuits according to inductive coupling requires a receiver circuit to capture data in keeping with the timing of passing a current through a transmitter coil. In short, a clock signal which decides the transmission timing is sent together with transmitted data, and the receiver is required to perform data reception in synchronization with the received clock. As to near field communication between 3D-stacked semiconductor integrated circuits, the variation in manufacturing and the difference in operating condition between the semiconductor integrated circuits directly influence the communication timing. On this account, it becomes necessary to perform the timing adjustment with high accuracy. In any of the patent documents cited above, no mention is made of that such highly accurate timing adjustment becomes necessary in regard to near field communication between 3D-stacked semiconductor integrated circuits.

It is an object of the invention to provide a semiconductor device which enables reduction of the whole scale of a circuit for adjusting the communication timing for near field communication between stacked semiconductor integrated circuits.

It is another object of the invention to provide a semiconductor device capable of adjusting the communication timing for near field communication between stacked semiconductor integrated circuits with high accuracy.

It is another object of the invention to provide a semiconductor integrated circuit which can contribute to actualization of a semiconductor device capable of adjusting the communication timing for near field communication between stacked semiconductor integrated circuits with high accuracy.

The above and other objects, and novel features of the invention will become apparent from the description hereof and the accompanying drawings.

Of the matters of the invention herein disclosed, representative one will be outlined below briefly.

As to a semiconductor device including a pair of stacked semiconductor integrated circuits capable of communicating with each other by wireless, each semiconductor integrated circuit has: a transmitter circuit operable to send, by wireless, transmit data together with a clock signal deciding a transmission timing, and arranged so that the wireless transmission timing can be adjusted; a receiver circuit operable to receive data in synchronization with a clock signal received by wireless, and arranged so that its wireless reception timing can be adjusted; and a control circuit operable to perform timing adjustments of the transmitter circuit and receiver circuit based on a result of authentication of data which is returned by the other semiconductor integrated circuit in response to data transmitted through the transmitter circuit, and is received by the receiver circuit.

According to the arrangement as described above, the control circuit which one semiconductor integrated circuit has can adjust the communication timing for a wireless communication loop, which runs to the other semiconductor integrated circuit, and returns back to the one semiconductor integrated circuit through a wireless communication interface circuit section of the semiconductor integrated circuit. Thus, the scale of the circuit of the device can be reduced in comparison to a case that receiver parts of both the paired semiconductor integrated circuits perform the timing adjustments individually.

In addition, the communication timing for near field communication between semiconductor integrated circuits can be adjusted with high accuracy even if there is a mismatch of e.g. the variations in manufacturing between the semiconductor integrated circuits. This is because the transmission timings of the transmitter clock signal and transmit data, the timing of the receiver clock, and the timing of data reception can be adjusted.

The effect provided by representative one of the matters of the invention herein disclosed will be described below briefly.

It is possible to reduce the scale of a circuit for adjusting the communication timing in near field communication between stacked semiconductor integrated circuits with respect to a whole semiconductor device.

Also, it is possible to adjust the communication timing in near field communication between stacked semiconductor integrated circuits with high accuracy.

BRIEF DESCRIPTION OF THE DRAWINGS

FIG. 6 is a waveform diagram showing, an example, relations among waveforms of transmit and receive signals and clock signals in the magnetically-inductive coupling method which takes advantage of a coil.

DETAILED DESCRIPTION OF THE PREFERRED EMBODIMENTS

1. Outlines of the Embodiments

Figure 1:
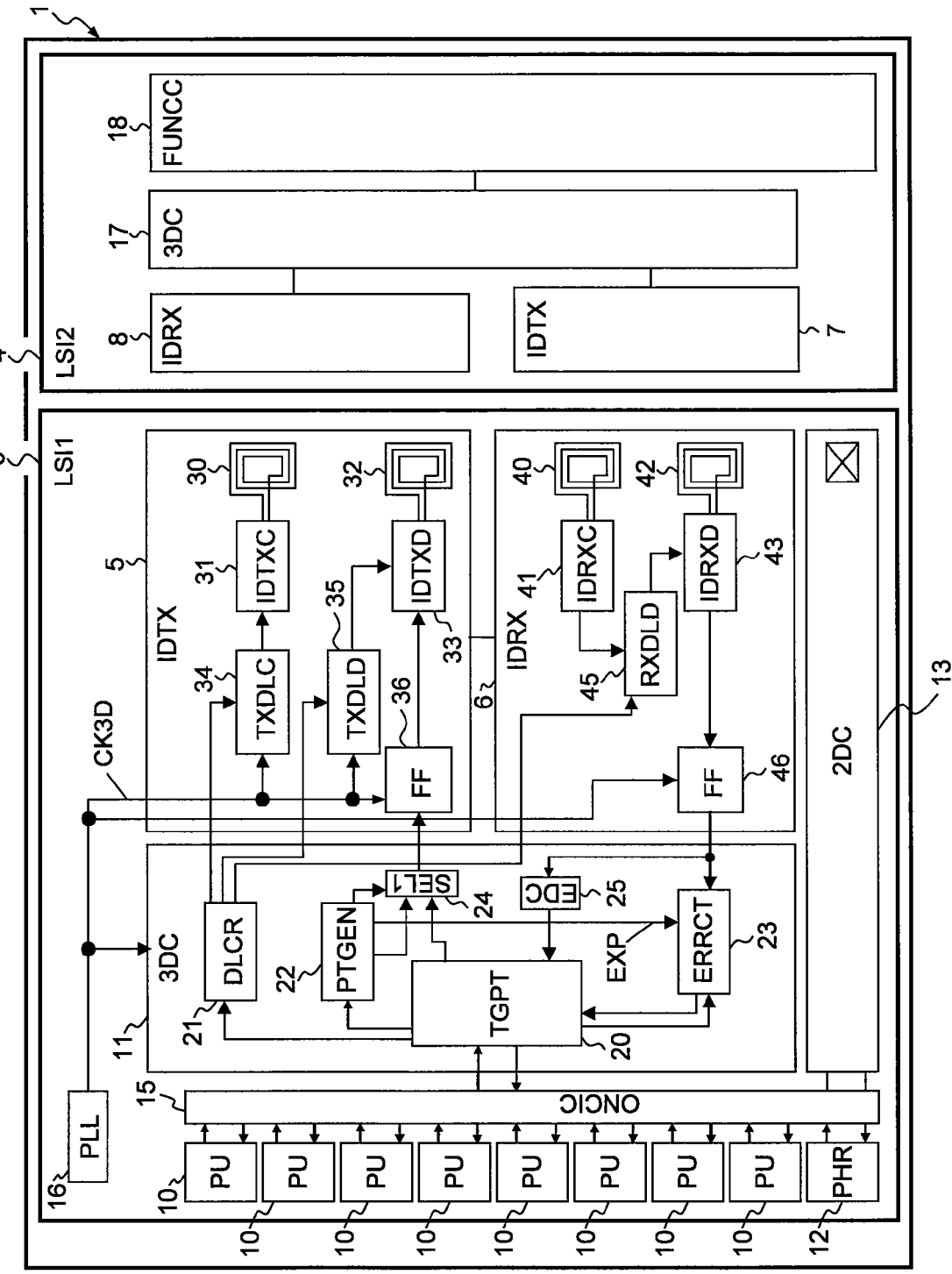
FIG. 1 is a block diagram showing, as an example, a semiconductor device according to the invention.

The preferred embodiments herein disclosed will be outlined first. Here, the reference characters and signs to refer to the drawings, which are accompanied with paired round brackets, only exemplify what the concepts of components or parts referred to by the characters and signs contain.

[1] A semiconductor device according to the invention includes a pair of stacked semiconductor integrated circuits capable of communicating with each other by wireless. The semiconductor integrated circuit has: a transmitter circuit operable to send transmit data by wireless, and arranged so that its wireless transmission timing can be adjusted based on control data set rewritably; a receiver circuit operable to receive data by wireless, and arranged so that its wireless reception timing can be adjusted based on control data set rewritably; and a control circuit operable to perform timing adjustments of the transmitter circuit and receiver circuit based on a result of authentication of data which is returned by the other semiconductor integrated circuit in response to data transmitted through the transmitter circuit, and is received by the receiver circuit.

According to the arrangement as described above, the control circuit which one semiconductor integrated circuit has can adjust the communication timing for a wireless communication loop, which runs to the other semiconductor integrated circuit, and returns back to the one semiconductor integrated circuit through a wireless communication interface circuit section of the semiconductor integrated circuit. Thus, the scale of the circuit of the device can be reduced in comparison to a case that receiver parts of both the paired semiconductor integrated circuits perform the timing adjustments individually.

[2] In the semiconductor device as described in [1], the transmitter circuit, for example, transmits data together with a transmitter clock signal in synchronization with the clock signal, and transmission timings of the transmitter clock signal and data are adjusted according to values of control data set in respective variable-delay circuits. The receiver circuit, for example, receives a clock signal and in parallel receives data in synchronization with the received clock signal, and a timing of data reception based on the received clock is adjusted according to a value of control data set in a variable-delay circuit.

According to the arrangement as described above, the communication timing for near field communication between semiconductor integrated circuits can be adjusted with high accuracy even if there is a mismatch of e.g. the variations in manufacturing between the semiconductor integrated circuits, or even if an operating condition such as a temperature or a source voltage is changed. This is because the transmission timings of the transmitter clock signal and transmit data, the timing of the receiver clock, and the timing of data reception can be adjusted.

[3] In the semiconductor device as described in [2], the transmission timings of the transmitter clock signal and data can be adjusted individually in the transmitter circuit. Thus, it becomes possible to conduct the timing adjustments more finely.

[4] In the semiconductor device as described in [1], the control circuit is e.g. a processor unit, and the processor unit writes transmit data transmitted from the transmitter circuit, and reads receive data received by the receiver circuit.

[5] In the semiconductor device as described in [4], the processor unit performs the timing adjustments in an initializing action by power-on reset and at a time when a communication error occurs. The details of the timing adjustments can be decided by operating a software program which the processor unit runs.

[6] The semiconductor device as described in [1], further includes: a pattern generator operable to generate transmit data and expected value data corresponding to the transmit data in succession; and a detection circuit operable to make a judgment on agreement between receive data returned in response to the transmit data generated by and transmitted from the pattern generator, and an expected value corresponding thereto, and to accumulate a result of the judgment. Thus, it becomes possible to conduct the timing adjustments readily, and the load on the processor unit can be lightened.

[7] In the semiconductor device as described in [6], the detection circuit accumulates the number of times that the judgment results in disagreement. Assuming an environment that e.g. ECC (Error Check and Correct) function can be utilized on receive data, as such environment affects the error-correcting ability, it becomes possible to judge whether or not to conduct the timing adjustments. In the condition that an error-correcting function such as ECC function is not taken into account, or cannot be utilized, the timing adjustments will be judged to be needed as a matter of course if the number of disagreements is an integer other than zero.

[8] In the semiconductor device as described in [6], the control circuit is a processor unit which can read a result of the judgment accumulated in the detection circuit. The details of the judging action can be decided by operating a software program which the processor unit runs.

[9] In the semiconductor device as described in [7], the processor unit performs the timing adjustments in an initializing action by power-on reset and at a time when a communication error occurs. The details of the timing adjustments can be decided by operating a software program which the processor unit runs.

[10] In the semiconductor device as described in [1], only one of the pair semiconductor integrated circuits has the transmitter circuit, receiver circuit and control circuit, and other of the pair semiconductor integrated circuits has a wireless communication interface circuit section for performing data reception from the transmitter circuit of the one semiconductor integrated circuit and data transmission to the receiver circuit of the one semiconductor integrated circuit respectively. The other semiconductor integrated circuit is e.g. a bus slave device such as a memory device.

[11] In the semiconductor device as described in [10], the wireless communication interface circuit section has a selector operable to selectively form a direct return path for sending back data received as-is. In timing adjustments, the other semiconductor integrated circuit needs no special action by an internal circuit connected with the wireless communication interface circuit.

[12] In the semiconductor device as described in [2], the pair of semiconductor integrated circuits each have the transmitter circuit, receiver circuit and control circuit. The paired semiconductor integrated circuits are both e.g. a bus master device of a microcomputer.

[13] In the semiconductor device as described in [12], each semiconductor integrated circuit further has a switch circuit operable to selectively form a direct return path for sending back data received by the receiver circuit thereof as-is through the transmitter circuit thereof. In timing adjustments, the semiconductor integrated circuit, which is the second party when viewed from the point of view of the semiconductor integrated circuit subjected to timing adjustments, needs no special action by an internal circuit connected with the transmitter circuit and receiver circuit.

[14] A semiconductor device according to another aspect of the invention includes a pair of stacked semiconductor integrated circuits capable of communicating with each other by wireless. In the semiconductor device, each semiconductor integrated circuit has: a transmitter circuit operable to send, by wireless, transmit data together with a clock signal deciding a transmission timing, and arranged so that the wireless transmission timing can be adjusted; a receiver circuit operable to receive data in synchronization with a clock signal received by wireless, and arranged so that its wireless reception timing can be adjusted; and a control circuit operable to perform timing adjustments of the transmitter circuit and receiver circuit based on a result of authentication of data which is returned by the other semiconductor integrated circuit in response to data transmitted through the transmitter circuit, and is received by the receiver circuit.

[15] A semiconductor integrated circuit according to still another aspect of the invention includes: a processor unit; and a wireless communication interface circuit. In the semiconductor integrated circuit, the wireless communication interface circuit has: a transmitter circuit operable to send transmit data by wireless, and arranged so that its wireless transmission timing can be adjusted based on control data set rewritably; and a receiver circuit operable to receive data by wireless, and arranged so that its wireless reception timing can be adjusted based on control data set rewritably. The processor unit performs timing adjustments of the transmitter circuit and receiver circuit based on a result of authentication of data returned from outside in response to data transmitted through the transmitter circuit, and received by the receiver circuit.

[16] In the semiconductor integrated circuit as described in [15], the transmitter circuit transmits data together with a transmitter clock signal in synchronization with the clock signal, and transmission timings of the transmitter clock signal and data are adjusted according to values of control data set in respective variable-delay circuits. The receiver circuit receives a clock signal and in parallel receives data in synchronization with the received clock signal, and a timing of data reception based on the received clock is adjusted according to a value of control data set in a variable-delay circuit.

2. Detailed Description of the Embodiments

The forms for embodying the invention, i.e. embodiments will be described further in detail in reference to the drawings, with provision that in all the drawings for explaining the embodiments, the components or parts identical in function are identified by the same reference numeral, and the iteration of the description thereof is omitted.

Figure 2:
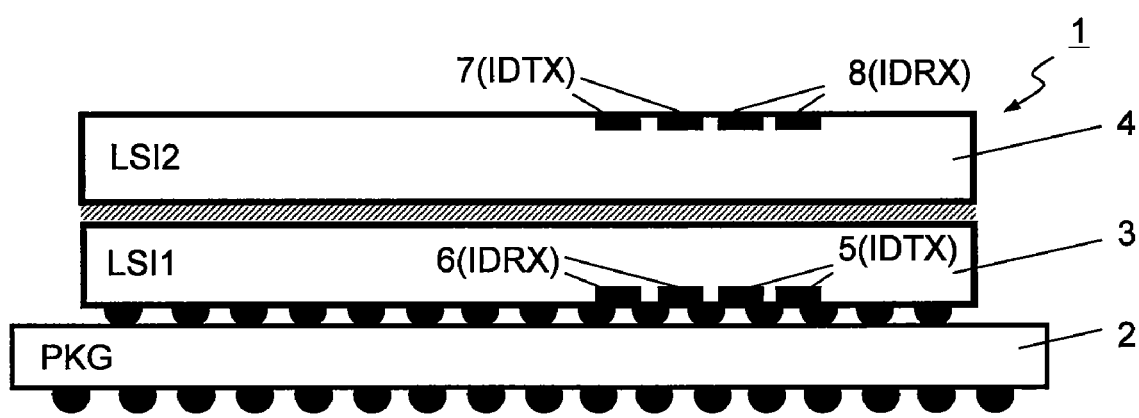
FIG. 2 is a sectional view schematically showing, an example, the whole semiconductor device according to the invention.

FIG. 2 presents a general view schematically showing, an example, a semiconductor device according to the invention. The semiconductor device 1 has a package board (PKG) 2 used as a wiring board, and two semiconductor integrated circuits (LSI1, LSI2) 3 and 4 stacked on the board, which is sealed with resin (not shown). On the rear face of the package board are formed external connection terminals composed of e.g. an array of solder balls. The semiconductor integrated circuit 3 has a transmitter circuit (IDTX) 5 and a receiver circuit (IDRX) 6, which serve as an interface circuit for wireless communication. The semiconductor integrated circuit 4 has a transmitter circuit (IDTX) 7 and a receiver circuit (IDRX) 8, which serve as an interface circuit for wireless communication. The receiver circuit 8 receives the data and clock signal transmitted by the transmitter circuit 5. The receiver circuit 6 receives the data and clock signal output by the transmitter circuit 7.

FIG. 1 is a block diagram showing, an example, the semiconductor device. In regard to the semiconductor integrated circuit 3, the reference numeral 10 denotes a processing unit (PU) such as a CPU (Central Processing Unit), in which multiple processing units are laid out. The numeral 11 denotes a control circuit (3DC) which controls the transmitter circuit 5 and receiver circuit 6 thereby to control wireless communication with the semiconductor integrated circuit 4. The control circuit 11 is connected with the transmitter circuit 5 and receiver circuit 6. The numeral 12 denotes a peripheral circuit (PHR) shown on behalf of all peripheral circuits, including other peripheral circuits. The numeral 13 denotes an interface circuit (2DC) for communication with other device through the external connection terminals of the package board 2; the device is mounted on a surface of the system board. The interface circuit 13, peripheral circuit 12, control circuit 11 and processing unit 10 are connected to an on-chip interconnect circuit (ONCIC) 15, and arranged to be mutually connectable through it. The interconnect circuit 15 includes e.g. a split transaction bus and a router, and performs bus control according to a data transfer protocol, in which a request packet from an initiator is forwarded to a target, and the target sends a response packet back to the transmitter, i.e. initiator on an as-needed basis. The numeral 16 denotes a PLL (phase-locked loop) circuit which produces a clock signal for an internal synchronizing operation of the semiconductor integrated circuit. In the drawing, an example of an internal clock signal CK3D output from PLL circuit 16 to the control circuit 11, transmitter circuit 5 and receiver circuit 6 is shown.

The semiconductor integrated circuit 4 is e.g. a memory device. The numeral 17 denotes a control circuit (3DC) which controls the transmitter circuit 7 and receiver circuit 8, and therefore controls wireless communication with the semiconductor integrated circuit 3. The numeral 18 denotes a processing circuit (FUNCC), which makes a memory unit having e.g. a memory array and a memory control circuit. The transmitter circuit 7 and receiver circuit 8 do not have a timing adjustment function for wireless communication, which is to be described later. The timing adjustment function is realized by the transmitter circuit 5, receiver circuit 6, control circuit 11 and other parts of the semiconductor integrated circuit 3.

Although there are various wireless communication systems, e.g. one which uses magnetically-inductive coupling, and one which uses electric field's capacity coupling, the invention adopts the magnetically-inductive coupling method which takes advantage of a coil. When a waveform in a reversed V shape shown by ITXW in FIG. 6 is supplied as input current to a transmitter-side coil, a receive voltage as shown by VRXW appears on a receiver-side coil. When taking out receive data in synchronization with the timing of the receive voltage, communication is enabled. In the example shown in FIG. 6, the value of the waveform VRXW is picked out in keeping with the timing of the leading edge of a clock signal CLK. For that, the leading edge timing of the clock signal CLK must be adjusted to coincide with a term SWD during which information arises in VRXW. The function of adjusting the timing in this way will be described below.

The control circuit 11 accepts access from the interconnector 15, and has a target port (TGPT) 20 for sending data to the interconnector 15. To the target port 20 are connected a storage circuit (DLCR) 21, a pattern generator (PTGEN) 22, an error-detection circuit (ERRCT) 23, a selector (SEL1) 24, and an error detector circuit (EDC) 25. The storage circuit 21 holds control data for adjustment of the timing of transmission and reception, and others. The control data are written by the predetermined processor unit 10 through the target port 20. The selector 24 selects transmit data output by the pattern generator 22, or transmit data forwarded from the interconnector 15 to the target port. The pattern generator 22 is a circuit for generating a test pattern for checking the status of communication. The error-detection circuit 23 compares the receive data which the semiconductor integrated circuit 4 returns in response to transmit data generated by the pattern generator 22 with data of an expected value generated by the pattern generator 22 thereby to judge whether or not an error has occurred, and then accumulates therein the number of the error judgments. The predetermined processor unit 10 will be able to read the number of error judgments thus accumulated through the target port 20. The pattern generator 22 and error-detection circuit 23 are provided to reduce the load on the processor unit 10 at the time of checking the status of communication. In case that the status of communication is judged without using the pattern generator 2 and error-detection circuit 23, the transmit data for the purpose is supplied to the target port 20 from the predetermined processor unit 10. It is checked by the error detector circuit 25 that there is neither the receive data returned by the semiconductor integrated circuit 4 in response to that nor the required response. Then, the result is returned to the predetermined processor unit 10 concerned. Even if the error detector circuit 25 is not incorporated, the fact of no required response can be judged from that the predetermined processor unit receives no response from the target port for a certain length of time. When having received a response, the predetermined processor unit 10 concerned judges whether or not the receive data returned in response to the transmit data agrees with what is expected, whereby the status of communication can be judged.

The transmitter circuit 5 has a transmitter driver (IDTXC) 31 for driving a wireless communication antenna 30 for sending clocks, and a transmitter driver (IDTXD) 33 for driving a wireless communication antenna 32 for sending data. To the transmitter driver 31 is connected a variable-delay circuit (XTDLC) 34 which causes, in the clock signal CK3D, an amount of delay specified by the control data held in the storage circuit 21, and outputs the signal thus delayed to the clock-transmitter driver 31. The clock-transmitter driver 31 treats the delayed clock signal output from the variable-delay circuit 34 as transmit signals, and activates the antenna 30. To the transmitter driver 33 is connected a variable-delay circuit (TXDLD) 35 which causes, in the clock signal CK3D, an amount of delay specified by the control data held in the storage circuit 21, and outputs the signal thus delayed to the data transmitter driver 33. The data transmitter driver 33 activates the antenna 30 according to the transmit data in a data register (FF) 36 in synchronizing with the leading edge of the delayed clock signal output from the variable-delay circuit 35. The ways of driving are as shown in FIG. 6. The clock CLK in FIG. 6 corresponds to the delayed clock signal output from the variable-delay circuit 35. The timing of data transmission shown by the waveform ITXW of FIG. 6, and the timing of clock transmission shown by the waveform CLK can be adjusted programmably by the control data set in the variable-delay circuits 34 and 35. The detail of the adjustment depends on a program which the predetermined processor unit 10 runs. The data output from the selector 24 is latched by the register 36 in synchronization with the clock signal CK3D. The timing of the latch may be in synchronizing with the delayed clock signal output from the variable-delay circuit 35. In this embodiment, the latch timing is synchronized with the clock signal CK3D output from the PLL circuit 16. As the control circuit 11 is made to work in synchronization with the clock signal CK3D, using the same clock as the clock latched by the first latch circuit (register 36) interfaced with the control circuit 11 can make it easier to design the interface timing of transmit data in case of separately designing the control circuit 11 and transmitter circuit 5.

The receiver circuit 6 includes a receiver driver 41 for driving a wireless communication antenna 40 for receiving clocks, and a receiver driver 42 for driving a wireless communication antenna 42 for receiving data. A clock signal received by the receiver driver 41 is supplied to a variable-delay circuit 45. The variable-delay circuit 45 causes an amount of delay specified by the control data held in the storage circuit 21 in the clock signal from the receiver driver 41, and outputs the signal thus delayed to the data receiver driver 43. The data receiver driver 43 receives data in synchronization with the leading edge of the delayed clock signal output from the variable-delay circuit 45, and supplies the received data to a receiver data register 46. Hence, the timing of data reception shown by the waveform VRXW of FIG. 6, and the timing of the clock shown by the waveform CLK can be adjusted programmably by the control data set in the variable-delay circuit 45. The detail of the adjustment depends on a program which the predetermined processor unit 10 runs. For the same reason, the timing of latch by the data register 46 is synchronized with the clock signal CK3D. The data latched by the data register 46 is supplied to the error-detection circuit 23 or error detector circuit 25.

In the example of FIG. 1, the semiconductor integrated circuit 3 starts communication with the semiconductor integrated circuit 4. The semiconductor integrated circuit 4 executes processing based on information transmitted from the circuit 3 and returns the result thereof.

The semiconductor integrated circuit which starts communication is hereinafter referred to as "master LSI 3", and the semiconductor integrated circuit 4 which receives an approach for communication from the master LSI 3 and returns a result of processing thereto is also referred to as "slave LSI 4".

Figure 3:
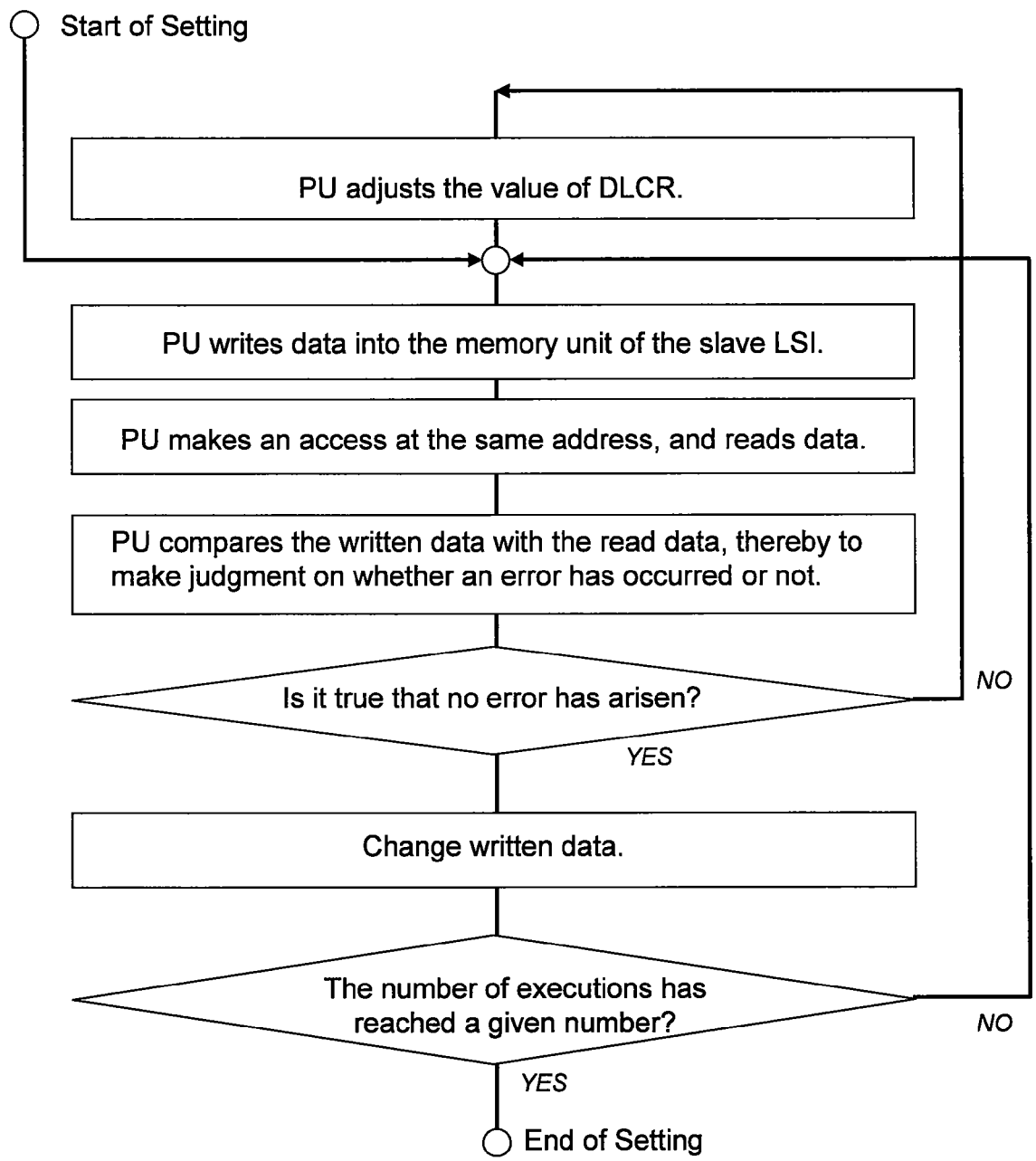
FIG. 3 is a flowchart showing, an example, a form of the flow for adjusting the communication timing of the semiconductor device shown in FIG. 1.

FIG. 3 shows, an example of the flow for adjusting the communication timing of the semiconductor device 1 according to an embodiment of the invention. In this example, the predetermined processor unit 10 generates a pattern for checking the status of communication, whereby the adjustment is performed. The predetermined processor unit 10 of the master LSI 3 writes data into and reads data from the memory unit 18 of the slave LSI 4, and compares a written value with a read value thereby to judge whether or not the communication is carried out correctly. In case of incorrect communication, the predetermined processor unit 10 changes a value of the storage circuit 21 in the control circuit 11 of the master LSI 3 thereby to vary the timing of transmission and reception, and a flow containing the steps of writing data, reading data and making a comparison between the written and read values is repeated until communication is established successfully. In case of correct communication, the predetermined processor unit 10 repeats the actions according to the steps of the flow including writing data into the memory unit 18 a given number of times while changing the value written. At the time when communication with no error has been established the given number of times, the adjustment is completed.

The timing adjustment should be performed before start of communication. Specifically, it must be executed at the time of initial setting by the power-on reset, i.e. initial setting right after the power-on, or at another time before starting communication between the stacked semiconductor integrated circuits 3 and 4. Thus, a communication error can be prevented from being caused by variations of the semiconductor integrated circuits in manufacturing. In case that a communication error arises in the middle of operation, such timing adjustment makes it possible to cope with changes of using conditions, such as the change in operating temperature, and the fluctuation in source voltage. The communication error arises when a response such as read data remains unreceived for a certain length of time, or when it is detected by the error detector circuit 25 that a bit error has been caused in response data. It is needless to say that the predetermined processor unit 10 can directly compare the written data with the read data, thereby to make a judgment on a communication error.

Figure 4:
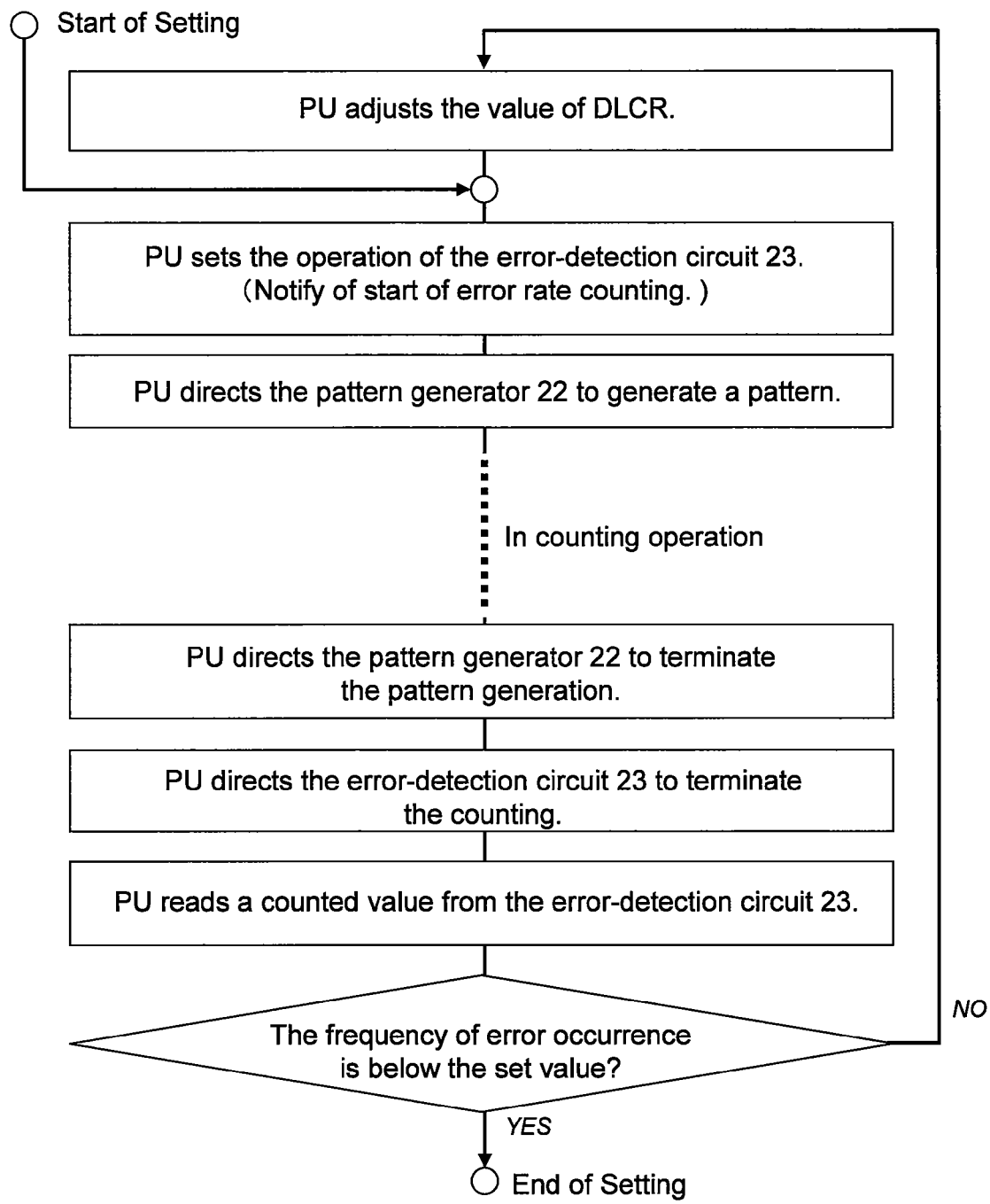
FIG. 4 is a flowchart showing, an example, another form of the flow for adjusting the communication timing of the semiconductor device.

FIG. 4 shows, an example of the flow for adjusting the communication timing of the semiconductor device 1 according to another embodiment. In this example, a self-detection mode is set for judging the status of communication. When the predetermined processor unit 10 instructs the control circuit 11 to enter the self-detection mode, the operation using the pattern generator 22 and error-detection circuit 23 is enabled. Specifically, the predetermined processor unit 10 in the master LSI 3 sets the error-detection circuit 23 to start to count a communication error. Then, the predetermined processor unit 10 concerned directs the pattern generator 22 to generate a pattern for testing the status of communication. In response to this, the pattern generator 22 generates a communication pattern. The data transmission from the master LSI 3 to the slave LSI 4 is started by the pattern thus generated. The slave LSI 4 returns response data from the memory unit 18 to the master LSI 3 in response to the data transmission. At that time, the error-detection circuit 23 of the master LSI 3 receives the response data, compares the response data with expected value data EXP from the pattern generator 22, counts up the number of errors, and stores the result. After elapse of a certain length of time, the predetermined processor unit 10 directs the pattern generator 22 to terminate pattern generation, instructs the error-detection circuit 23 to terminate error counting, and reads an error counted value from the error-detection circuit 23. In case that an error has occurred, and communication is not performed correctly, the processor unit 10 concerned changes data of the storage circuit 21 of the master LSI 3 thereby to vary the timing of transmission and reception, and then repeats the same steps as described above. Until communication is performed correctly, a series of the steps are conducted repeatedly. Using the self-detection mode, the load on the processor unit 10 owing to the timing adjustment can be lightened.

Figure 5:
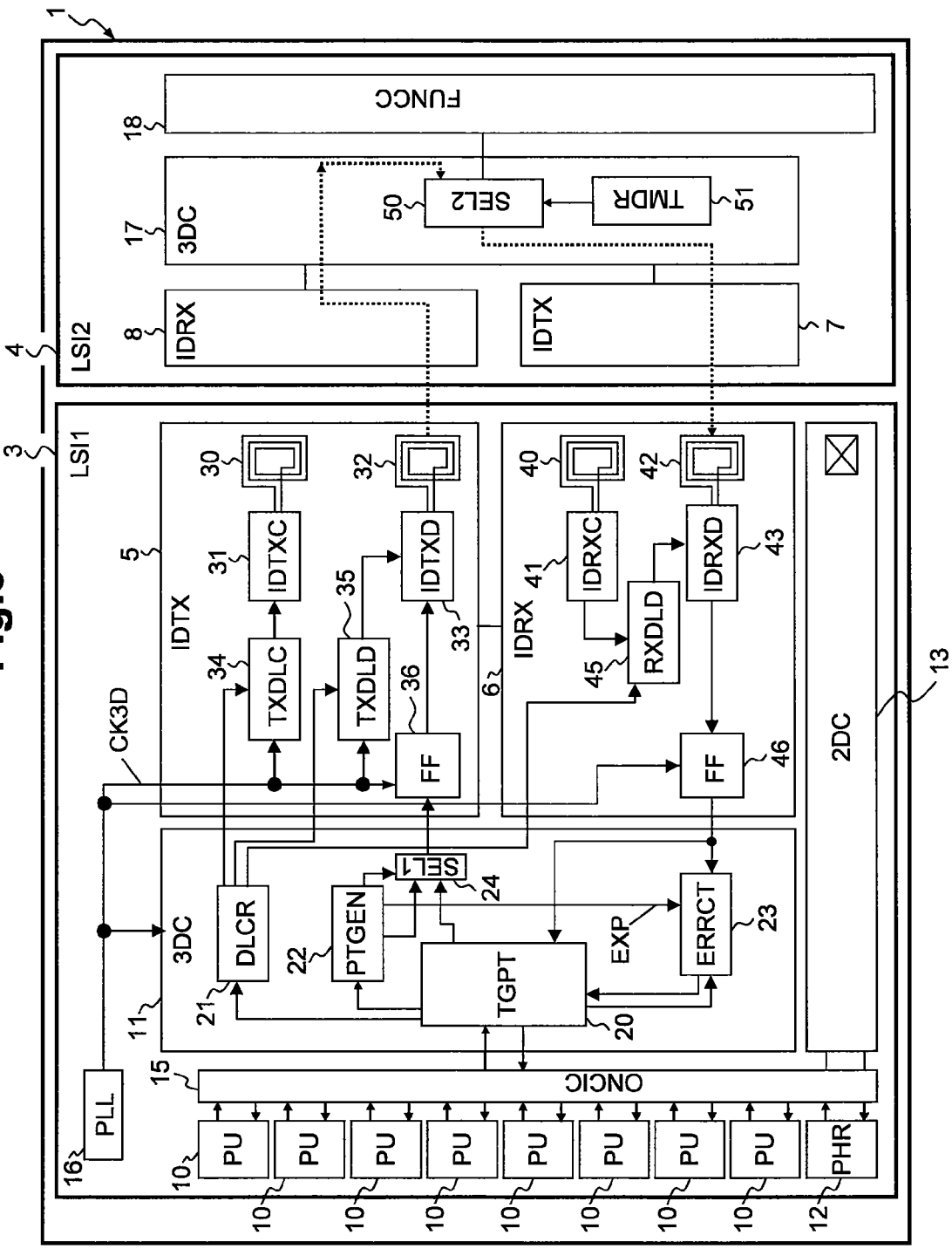
FIG. 5 is a block diagram showing, an example, the semiconductor device arranged so that the semiconductor integrated circuit serving as a bus slave device can select a direct return path in timing adjustment.

FIG. 5 shows, an example of the semiconductor device 1 according to another embodiment of the invention. The semiconductor device 1 of this example differs from that shown in FIG. 1 in that the semiconductor integrated circuit 4 serving as a bus slave device can select a direct return path at the time of timing adjustment by the semiconductor integrated circuit 3 serving as a master device. The direct return path is shown by a dotted line in the drawing, along which data are transferred in the timing adjustment. Specifically, the receiver circuit 8 receives the data transmitted from the transmitter circuit 5, and the data is not passed to the internal circuit (memory unit) 18, but directly sent to the transmitter circuit 7. Then, the data is returned to the semiconductor integrated circuit 3 through the transmitter circuit 7 directly. The selector (SEL2) 50 serves to select the direct return path. The select data of the selector 50 is held by the storage circuit (TMDR) 51. In the initial condition after power-on reset, the memory unit 18 is put in a state that the direct return path is selected. After adjustment of the communication timing, the processor unit 10 of the semiconductor integrated circuit 3 serving as a master device overwrites the select data of the storage circuit 41, whereby a memory operation using the memory unit 18 is enabled. Hence, the slave LSI 4 is allowed to send the data, which has been passed from the master LSI 3, back to the master LSI 3 as it is without conducting an operation on the data. Therefore, the master LSI 3 can receive data as it is, which the master LSI has sent out per se. On this account, the number of communications for timing adjustment can be reduced, and timing adjustment can be conducted efficiently. For example, in the case shown with reference to FIG. 3, the step of reading the value of written data can be omitted. In addition, as the internal circuit 18 of the slave LSI 4 is not allowed to work, the advantage that only an interface part of wireless communication can be inspected is brought. Now, it is noted that in the example shown in FIG. 5, the error detector circuit 25 is omitted.

The semiconductor devices as described above can offer the effects and advantages as follows.

(1) The communication timing in a wireless communication loop running through the wireless communication interface circuits 7 and 8 between semiconductor integrated circuits 3 and 4 can be adjusted by the control circuit 11 which one semiconductor integrated circuit 3 has. The circuit can be scaled down further in comparison to the case of putting the receiver parts of the two semiconductor integrated circuits 3 and 4 in charges of executing timing adjustment respectively.

(2) In the semiconductor integrated circuit 3 serving as a master device which starts communication between the semiconductor integrated circuits 3 and 4, a group of circuits 5, 6, 10 and 11 for controlling the communication timing are incorporated. In general, a semiconductor integrated circuit serving as a master device which starts communication has a processing unit therein, and the communication timing can be adjusted by a software program. The semiconductor integrated circuit 4, a party which the semiconductor integrated circuit 3 serving as such master device communicates with, is often a slave device like a memory. However, in many cases, it is not proper for such slave device to be equipped with a control function for timing adjustment. Also, in this respect, the load on the slave device can be minimized by performing the timing adjustment on the side of the semiconductor integrated circuit 3 serving as a master device.

(3) In case that communication between stacked semiconductor integrated circuits is performed by wireless, the following are conceivable: no communication channel is established before start of wireless communication, and it is difficult for the slave device to gain information of start of the timing adjustment. In this respect, the semiconductor integrated circuit serving as a master device and having the timing adjustment function can cope with such case.

(4) The transmission timing of the transmitter clock signal and transmit data, the timing of the receiver clock, and the timing of data reception can be adjusted. Therefore, even if there is some mismatch between the respective semiconductor integrated circuits 3 and 4 concerning the variations in manufacturing or even if an operating condition such as a temperature or a source voltage is changed, the communication timing for near field communication between semiconductor integrated circuits can be adjusted with high accuracy.

While the invention, which was made by the inventor, has been specifically described above based on the embodiments, the invention is not limited to the embodiments. It is obvious that various modifications and changes may be made without departing from the subject matter hereof.

For example, a combination of stacked semiconductor integrated circuits is not limited to a combination of master and slave devices, which may be a combination of a microcomputer and an accelerator, or a combination of multiple microcomputers. In such combinations, the semiconductor integrated circuits of both the parties may each have a timing adjustment function. In such cases, the direct return path as described with reference to FIG. 5 may be provided in the semiconductor integrated circuit serving as a master device. For instance, such direct return path may be materialized by providing a selector in a route running from the data register 46 to the data register 35 in FIG. 1. Also, the slave device is not limited to a memory, and it may be other device. Further, the number of stacked semiconductor integrated circuits is not limited to two, and it may be three or more. The semiconductor integrated circuits may be packaged individually, or may each remain a bare chip. The bus of the semiconductor integrated circuit is not limited to a split transaction bus, and it may be a bus according to an arbitration method, by which exclusive use of the bus is allowed by a BUS ACKNOWLEDGE signal issued in response to a bus request. The wireless communication method may be another communication method such as the electric field's capacity coupling method.

What is claimed is:

1. A semiconductor device comprising:
a pair of stacked semiconductor integrated circuits capable of communicating with each other by wireless,
wherein one of the pair of semiconductor integrated circuits has
a transmitter circuit operable to send, by wireless, transmit data to the other of the pair of semiconductor integrated circuits, and arranged so that its wireless transmission timing can be adjusted based on rewritable control data,
a receiver circuit operable to receive data from the other of the pair of semiconductor integrated circuits by wireless, and arranged so that its wireless reception timing can be adjusted based on rewritable control data, and
a control circuit operable to perform timing adjustments of the transmitter circuit and receiver circuit based on data sent by the other of the pair of semiconductor integrated circuits in response to data sent from the transmitter circuit to the other of the pair of semiconductor integrated circuits and received by the receiver circuit.

2. The semiconductor device according to claim 1, wherein the transmitter circuit transmits data together with a transmitter clock signal in synchronization with the clock signal, and
transmission timings of the transmitter clock signal and data are adjusted according to values of control data set in respective variable-delay circuits, and the receiver circuit receives a clock signal and in parallel receives data in synchronization with the received clock signal, and a timing of data reception based on the received clock is adjusted according to a value of control data set in a variable-delay circuit.

3. The semiconductor device according to claim 2, wherein the transmission timings of the transmitter clock signal and data can be adjusted individually in the transmitter circuit.

4. The semiconductor device according to claim 1, wherein the control circuit is a processor unit, and the processor unit writes transmit data transmitted from the transmitter circuit, and reads receive data received by the receiver circuit.

5. The semiconductor device according to claim 4, wherein the processor unit performs the timing adjustments in an initializing action by power-on reset and at a time when a communication error occurs.

6. The semiconductor device according to claim 1, further comprising:

a pattern generator operable to generate transmit data and expected value data corresponding to the transmit data in succession; and a detection circuit operable to make a judgment on agreement between receive data returned in response to the transmit data generated by and transmitted from the pattern generator, and an expected value corresponding thereto, and to accumulate a result of the judgment.

7. The semiconductor device according to claim 6, wherein the detection circuit accumulates the number of times that the judgment results in disagreement.

8. The semiconductor device according to claim 6, wherein the control circuit is a processor unit which can read a result of the judgment accumulated in the detection circuit.

9. The semiconductor device according to claim 7, wherein the processor unit performs the timing adjustments in an initializing action by power-on reset and at a time when a communication error occurs.

10. The semiconductor device according to claim 1, wherein only one of the pair of semiconductor integrated circuits has the transmitter circuit, receiver circuit and control circuit, and other of the pair of semiconductor integrated circuits has a wireless communication interface circuit section for performing data reception from the transmitter circuit of the one semiconductor integrated circuit and data transmission to the receiver circuit of the one semiconductor integrated circuit respectively.

11. The semiconductor device according to claim 10, wherein the wireless communication interface circuit section has a selector operable to selectively form a direct return path for sending back data received as-is.

12. The semiconductor device according to claim 2, wherein the pair of semiconductor integrated circuits each have the transmitter circuit, receiver circuit and control circuit.

13. The semiconductor device according to claim 12, wherein each semiconductor integrated circuit further has a switch circuit operable to selectively form a direct return path for sending back data received by the receiver circuit thereof as-is through the transmitter circuit thereof.

14. A semiconductor device comprising:

a pair of stacked semiconductor integrated circuits capable of communicating with each other by wireless, wherein each semiconductor integrated circuit has a transmitter circuit operable to send, by wireless, transmit data together with a clock signal deciding a transmission timing, and arranged so that the wireless transmission timing can be adjusted, a receiver circuit operable to receive data in synchronization with a clock signal received by wireless, and arranged so that its wireless reception timing can be adjusted, and a control circuit operable to perform timing adjustments of the transmitter circuit and receiver circuit based on a result of authentication of data which is returned by the other semiconductor integrated circuit in response to data transmitted through the transmitter circuit, and is received by the receiver circuit.

15. A semiconductor integrated circuit comprising:

a processor unit; and a wireless communication interface circuit, wherein the wireless communication interface circuit has a transmitter circuit operable to send transmit data by wireless, and arranged so that its wireless transmission timing can be adjusted based on control data set rewritably, and a receiver circuit operable to receive data by wireless, and arranged so that its wireless reception timing can be adjusted based on control data set rewritably, and the processor unit performs timing adjustments of the transmitter circuit and receiver circuit based on a result of authentication of data which is returned from outside in response to data transmitted through the transmitter circuit, and is received by the receiver circuit.

16. The semiconductor integrated circuit according to claim 15, wherein the transmitter circuit transmits data together with a transmitter clock signal in synchronization with the clock signal, and transmission timings of the transmitter clock signal and data are adjusted according to values of control data set in respective variable-delay circuits, and the receiver circuit receives a clock signal and in parallel receives data in synchronization with the received clock signal, and a timing of data reception based on the received clock is adjusted according to a value of control data set in a variable-delay circuit.

\* \* \* \* \*